United States Patent
Tseng

(10) Patent No.: US 6,596,589 B2
(45) Date of Patent: Jul. 22, 2003

(54) METHOD OF MANUFACTURING A HIGH COUPLING RATIO STACKED GATE FLASH MEMORY WITH AN HSG-SI LAYER

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/976,446

(22) Filed: Oct. 12, 2001

(65) Prior Publication Data

US 2002/0160571 A1 Oct. 31, 2002

Related U.S. Application Data

(63) Continuation-in-part of application No. 09/846,468, filed on Apr. 30, 2001.

(51) Int. Cl.[7] .............................................. H01L 21/336
(52) U.S. Cl. ....................... 438/260; 438/259; 438/264; 438/270; 438/296
(58) Field of Search ................................ 438/260, 259, 438/264, 270, 296, 589, 657

(56) References Cited

U.S. PATENT DOCUMENTS 6,413,809 B2 * 7/2002 Nakamura et al. .......... 438/201

* cited by examiner

*Primary Examiner*—Richard Elms
*Assistant Examiner*—Beth E. Owens
(74) *Attorney, Agent, or Firm*—Clement Cheng

(57) ABSTRACT

A stacked-gate flash memory cell includes a trench formed in a substrate and a tunneling oxide layer formed on the substrate. A first part of the floating gate is formed on the tunneling oxide layer. A protruding isolation filler is formed in the trench and protrudes over the upper surface of the first part of the floating gate, thereby forming a cavity between the two adjacent raised isolation structures. A second part of the floating gate is formed of HSG-Si over the surface of the cavity to have a U-shaped structure in cross sectional view. A dielectric layer is conformably formed on the surface of the second part of the floating gate and the isolation structures, and a control gate is formed on the dielectric layer.

14 Claims, 2 Drawing Sheets

METHOD OF MANUFACTURING A HIGH COUPLING RATIO STACKED GATE FLASH MEMORY WITH AN HSG-SI LAYER

This is a continuation-in-part application of Ser. No. 09/846,468, filed on Apr. 30, 2001.

The present invention relates to a semiconductor device, and more specifically, to a flash memory having high coupling ratio and the method of fabricating the nonvolatile memory.

BACKGROUND OF THE INVENTION

The semiconductor industry has been advanced to the field of Ultra Large Scale Integrated (ULSI) technologies. The fabrication of the nonvolatile memories also follows the trend of the reduction of the size of a device. The high-density nonvolatile memories can be applied as the mass storage of portable handy terminals, solid state camera and PC cards. That is because that the nonvolatile memories exhibit many advantages, such as a fast access time, low power dissipation, and robustness. Further, it can be used to replace magnetic disk memory. The nonvolatile memories include various types of devices, such as EAROM (electrically alterable read only memory), EEPROM (electrically erasable programmable read only memory), EEPROM-EAROMs and non-volatile SRAMs.

Different types of devices have been developed for specific applications requirements in each of the segments of memory. In the device, electrical alterability is achieved by Fowler-Nordheim tunneling which is cold electron tunneling through the energy barrier at a silicon-thin dielectric interface and into the oxide conduction band. Typically, the thin dielectric layer is composed of silicon dioxide and the thin silicon dioxide layer allows charges to tunnel through when a voltage is applied to the gate. These charges are trapped in the silicon dioxide and remain trapped there since the materials are high quality insulators. A conventional flash memory is a type of erasable programmable read-only memory (EPROM) One of the advantages of flash memory is its capacity for block-by-block memory erasure. Furthermore, the speed of memory erasure is fast. For other EPROM, the memory erasure can take up to several minutes due to the erase mode of such type memory is done by bit-by-bit.

Various flash memories have been disclosed in the prior art, the type of the flash includes separated-gate and stacked-gate structure. U.S. Pat. No. 6,180,454 to Chang, et al, entitled "Method for forming flash memory devices", was filed on Oct. 29, 1999. A further U.S. Pat. No. 6,153,906 to Chang, was filed on Dec. 8, 1998. The device includes an oxide layer on a substrate. A stacked gate is formed on the substrate. A tunnel diffusion region is formed in the substrate next to a first side of the stacked gate. The tunnel diffusion region extends to a portion of the substrate under the stacked gate. A doped region is formed in the substrate next to a second side of the stacked gate. The doped region is distant away from the stacked gate by a lateral distance. U.S. Pat. No. 5,956,268 discloses a Nonvolatile memory structure. The prior art allows for array, block erase capabilities.

U.S. Pat. No. 6,153,494 to Hsieh, et al., entitled "Method to increase the coupling ratio of word line to floating gate by lateral coupling in stacked-gate flash" was filed on Feb. 11, 1998. The object of this invention is to provide a method of forming a stacked-gate flash memory having a shallow trench isolation with a high-step in order to increase the lateral coupling between the word line and the floating gate. Hsieh disclosed a step of forming a nitride layer and then forming a shallow trench isolation (STI) structure through the nitride layer into the substrate. Then, after oxide is filled into the STI, the nitride is then removed leaving behind a deep opening about the filled STI. The detailed description may refer to the prior art. A stacked-gate flash memory cell is provided having a shallow trench isolation with a high-step of oxide and high lateral coupling.

Hemispherical grain silicon (HSG-Si) is a silicon layer with a rough surface to increase surface area. It has been applied in the field of DRAM. For example, see the article entitled "A Capacitor-Over-Bit-Line Cell with a Hemispherical Grain Storage Node For 64 Mb Drams", IEDM Tech Dig., December 1990, pp 655–658). The HSG-Si is deposited by a low pressure chemical vapor deposition method at the transition temperature from amorphous Si to polycrystalline Si. This memory cell provides large storage capacitance by increasing the effective surface area of a simple storage node and is manufactured by optical delineation. The HSG-Si storage node can be fabricated by addition of two process steps, i.e. HSG-Si deposition and a etchback. HSG-Si appeared on silicon surface by using a seeding method.

SUMMARY OF THE INVENTION

The object of the present invention is to form flash memory with a higher coupling ratio.

It is another object of this invention to provide a method of forming a stacked-gate flash memory having HSG-Si to increase the coupling ratio between the control gate and the floating gate of the cell.

The stacked-gate flash memory cell includes a trench formed in a substrate and a tunneling oxide is formed on the substrate. A first part of the floating gate is formed on the tunneling oxide. A raised isolation filler is formed in the trench and protrudes over the upper surface of the first part of the floating gate, thereby forming a cavity between the two adjacent raised isolation fillers. A second part of the floating gate is formed along the surface of the cavity to have a U-shaped structure in cross sectional view. A dielectric layer is conformally formed on the surface of the second part of the floating gate and a control gate is formed on the dielectric layer.

The method comprises forming a first dielectric layer on a semiconductor substrate as a tunneling dielectric and forming a first conductive layer and a sacrificial layer on the first dielectric layer. The next step is to pattern the sacrificial layer, the first dielectric layer, the first conductive layer and the substrate to form a trench in the substrate. An isolation material fills the trench, a portion of the isolation material is removed to the surface of the sacrificial layer. The sacrificial layer is then removed, thereby forming a cavity between adjacent isolation structures. A second conductive layer is formed along a surface of the cavity and the isolation structure. Next, a portion of the second conductive layer is removed to the surface of the isolation structure. Subsequently, a second dielectric layer is formed on a surface of the floating gate, and a third conductive layer is formed on the second dielectric layer as a control gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
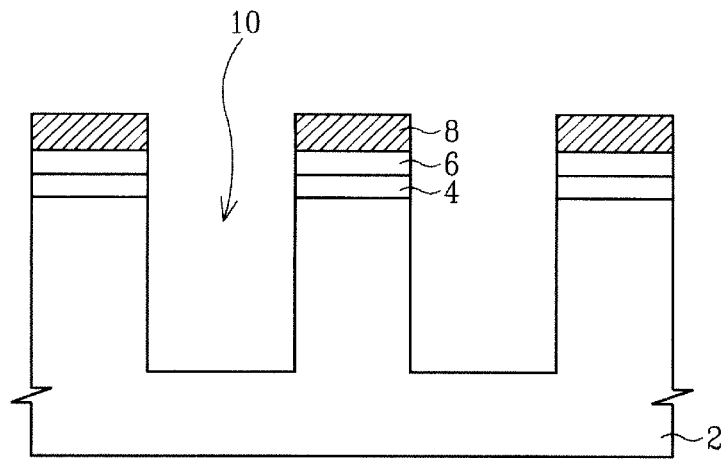
FIG. 1 is a cross section view of a semiconductor wafer illustrating the steps of forming a trench in a substrate according to the present invention.
Figure 2:
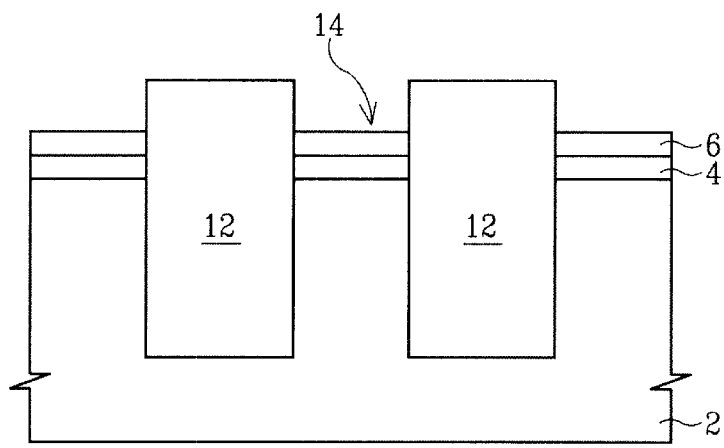
FIG. 2 is a cross section view of a semiconductor wafer illustrating the step of forming a protruding isolation structure according to the present invention.
Figure 3:
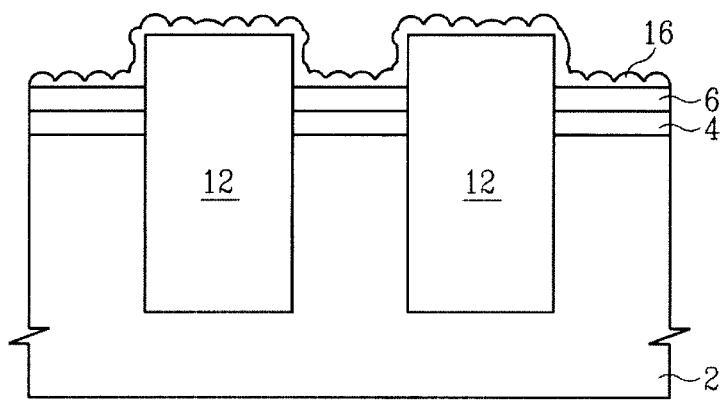
FIG. 3 is a cross section view of a semiconductor wafer illustrating the step of forming HSG-Si according to the present invention.
Figure 4:
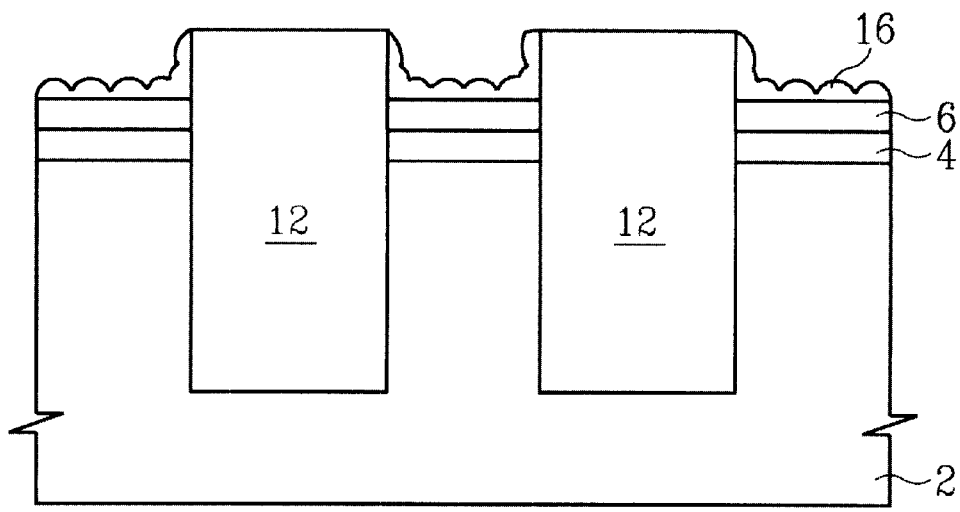
FIG. 4 is a cross section views of a semiconductor wafer illustrating the step of removing a portion of the HSG-Si according to the present invention.
Figure 5:
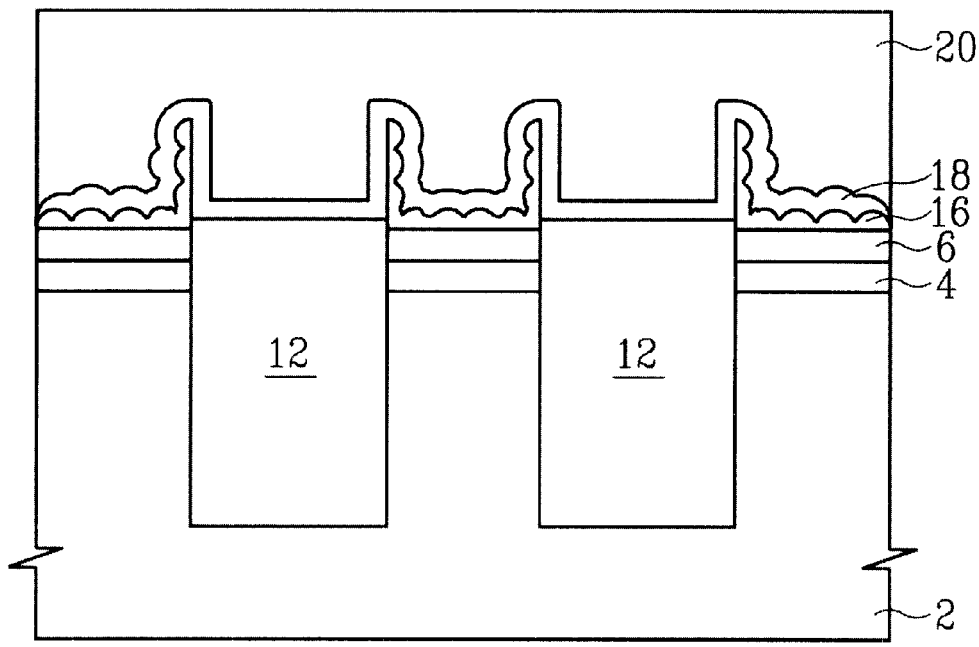
FIG. 5 is a cross section views of a semiconductor wafer illustrating the step of forming a control gate according to the present invention.

The present invention proposes a novel structure and method to fabricate the stacked-gate flash memory. The stacked-gate flash memory cell includes a trench formed in a substrate 2, as shown in FIG. 1. A tunneling oxide 4 is formed on the surface of the substrate 2 and adjacent to the trench 10. A first part 6 of the floating gate is formed on the tunneling gate oxide 4. A protruding isolation structure (filler) 12 is formed in the trench and protruding over the upper surface of the first part 6 of the floating gate, thereby forming a cavity 14 between the adjacent protruding isolation structure filler 12, as shown in FIG. 2. A second part 16 of the floating gate is formed along the-surface of the cavity 14 to have a U-shaped structure in a cross sectional view. The second part 16 of the floating gate is formed of HSG-Si, wherein FIG. 3 illustrates a conformal HSG-Si layer being formed on the surface, followed by a removing step in FIG. 4 to yield the U-shaped structure. A dielectric layer 18 is conformably formed on the surface of the second part of the floating gate 16 and a control gate 20 is formed on the dielectric layer, as shown in FIG. 5.

The method of forming the structure is described as follows. In the method, a trench is formed and a floating gate is formed in the trench to increase the coupling ratio. The detailed description of the method will be described as follows. In a preferred embodiment, as shown in FIG. 1, a single crystal silicon substrate 2 with a <100> or <111> crystallographic orientation is provided. A dielectric, such as oxide layer 4, is formed on the substrate 2 as a tunneling dielectric layer. Typically, the oxide 4 can be grown in an oxygen ambient in a furnace at a temperature of about 800 to 1100 degrees centigrade. The thickness of the silicon oxide layer 4 is about 50 to 500 angstroms. Other methods, such as chemical vapor deposition, can be used to form the oxide 4. It is appreciated that any suitable material such as silicon oxynitride may be used as the gate dielectric. Preferably, the silicon oxynitride layer is formed by thermal oxidation in an $N_2O$ or NO environment. The temperature for forming the silicon oxynitride layer 4 ranges from 700 to 1150 degrees centigrade.

Next, as can be seen by reference to FIG. 1, a conductive layer, such as a doped polysilicon layer, is formed on the oxide layer 4 as the first part 6 of a floating gate. The doped polysilicon layer 6 can be chosen from doped polysilicon or in-situ doped polysilicon. This is achieved preferably through a LPCVD method employing saline as a silicon source material at a temperature range between about 500 to 650 degrees C. The thickness of the polysilicon is about 2000–6000 angstroms. Next, a sacrificial layer 8 is subsequently formed on the doped polysilicon layer 6. Preferably, the material used to form the sacrificial layer 8 is nitride. The silicon nitride layer 8 is deposited by any suitable process. For example, Low Pressure Chemical Vapor Deposition (LPCVD), Plasma Enhance Chemical Vapor Deposition (PECVD), High Density Plasma Chemical Vapor Deposition (HDPCVD). In the preferred embodiment, the reaction gases of the step to form silicon nitride layer include $SiH_4$, $NH_3$, $N_2$ or $SiH_2Cl_2$, $NH_3$, $N_2$.

A photoresist is patterned on the sacrificial layer 8 to define the trench region, followed by etching the stacked layer consisting of the sacrificial layer 8, the polysilicon layer 6, dielectric layer 4 and the substrate 2 to form trenches 10 in the substrate 2. The photoresist is next removed by oxygen plasma ashing. Subsequently, trench 10 is filled with isolation oxide 12, using the method of high density plasma (HDP) deposition or LPCVD. Next; the substrate 2 is subjected to chemical-mechanical polishing (CMP), thus forming shallow trench isolation (STI) 12 as shown in FIG. 2. Then, the sacrificial layer 8 is removed by a hot phosphorous acid solution, thereby forming the protruding isolation filler 12, which protrudes over the surface of the polysilicon layer 6. A cavity 14 is therefore formed between the raised isolation filler 12. The high step of the protruding isolation filler 12 can be defined by the thickness of the sacrificial layer 8. Hence, the coupling ratio can be controlled by the present invention.

Next, referring to FIG. 3, a conductive layer such as in-situ doped polysilicon is deposited along the surface of the cavity 14 and the protruding isolation filler 12 as the second part 16 of a floating gate. Preferably, the conductive layer 16 is formed by HSG-Si layer to increase the surface area. The thickness of the conductive layer 16 is about 100–1000 angstroms. Next, the HSG-Si layer 16 is removed to expose the upper surface of the protruding isolation filler 12 by CMP. The HSG-Si layer 16 only remains on side wall and bottom of the cavity 14, as shown in FIG. 4.

The polysilicon layer 6 and the remained HSG-Si layer 16 serve as a floating gate and isolated by the protruding isolation filler 12. As another key aspect of the present invention, the remaining HSG-Si layer 16 is conformably formed so as to follow the contours of the cavity 14, thus providing additional surface area to the control gate dielectric that is to be formed later. In another words, HSG-Si should not totally fill the cavity 14.

Turning to FIG. 5, the upper portion of the protruding isolation filler 12 is removed by selective etching, thereby increasing the coupling ratio due to additionally exposed surface area of the HSG-Si layer. Next an interpoly dielectric layer 18 is formed over the contours of the conformal floating gate and the upper surface of the protruding isolation filler 12, as shown in FIG. 5. It is preferred that the interpoly dielectric layer 18 comprises but is not limited to oxide/nitride/oxide (ONO), ON. Then, another polysilicon layer 20 is formed over the interpoly dielectric layer 18 to act as the control gate and word line. Thus, a stacked-gate flash memory is formed as shown in the cross-sectional view of FIG. 5. A further patterning may be used to define the control gate.

The higher coupling can be obtained due to the floating gate formed against the high-step oxide protruding over the isolation trench of the present invention. The HSG-Si with larger surface area is used. Further, the filler 12 is etched prior to forming the interpoly dielectric layer 18 to expose the side surface of the HSG-Si.

It has to be noted that the first conductive layer 6 can be omitted and to increase the thickness of the sacrificial layer 8 in order to increase the coupling surface. After the isolation structure 12 is formed, the entire sacrificial layer 8 is removed. The following sequences are similar to the aforementioned embodiment to deposit the conductive layer 16, polish the layer 16 and to form the ONO 18 and the control gate 20.

The stacked-gate flash memory cell includes trenches formed in a substrate 2, a tunneling oxide 4 is formed on the surface of the substrate 2 and adjacent to the trench 5. A protruding isolation structure (filler) 12 is formed in the trench and protruding over the upper surface of the tunneling oxide 4, thereby forming a cavity 14 between the adjacent protruding isolation filler 10. A floating gate 16 is formed along the surface of the cavity 14 to have a U-shaped structure with a rough surface in cross sectional view. A dielectric layer 18 is conformably formed on the surface of the second part of the floating gate 16 and a control gate 20 is formed on the dielectric layer 18.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method of manufacturing a stacked-gate flash memory, comprising:

forming a first dielectric layer on a semiconductor substrate as a tunneling dielectric;

forming a first conductive layer on said first dielectric layer;

forming a sacrificial layer on said conductive layer;

patterning said sacrificial layer, said first dielectric layer, said first conductive layer and said substrate to form trenches in said substrate;

forming isolation structures in said trenches;

removing said sacrificial layer, thereby forming a cavity between said isolation structures with said isolation structures protruding over said first conductive layer;

forming an HSG-Si layer over a surface of said cavity and said isolation structures;

removing a portion of said HSG-Si layer to a surface of said isolation structures, wherein said HSG-Si layer and said first conductive layer act as a floating gate;

forming a second dielectric layer on a surface of said floating gate; and forming a second conductive layer on said second dielectric layer as a control gate.

2. The method of claim 1, wherein said sacrificial layer comprises nitride.

3. The method of claim 2, wherein said sacrificial layer is removed by hot phosphorous acid solution.

4. The method of claim 1, wherein said HSG-Si layer is removed by chemical-mechanical polishing.

5. The method of claim 1, wherein said second dielectric layer comprises oxide/nitride.

6. The method of claim 1, wherein said second dielectric layer comprises oxide/nitride/oxide.

7. The method of claim 1, further comprising a step of removing an upper portion of the isolation structures prior to forming said second dielectric layer.

8. A method of manufacturing a stacked-gate flash memory, comprising:

forming a first dielectric layer on a semiconductor substrate as a tunneling dielectric;

forming a sacrificial layer on said first dielectric layer;

patterning said sacrificial layer, said first dielectric layer and said substrate to form trenches in said substrate;

forming isolation structures in said trenches;

removing said sacrificial layer, thereby forming a cavity between said isolation structures with said isolation structures protruding over said first dielectric layer;

forming an HSG-Si layer over a surface of said cavity and said isolation structures;

removing a portion of said HSG-Si layer to a surface of said isolation structures, wherein said HSG-Si layer acts as a floating gate;

forming a second dielectric layer on a surface of said floating gate; and forming a first conductive layer on said second dielectric layer as a control gate.

9. The method of claim 8, further comprising a step of removing an upper portion of the isolation structures prior to form said second dielectric layer.

10. The method of claim 8, further comprising a step of forming a second conductive layer after forming said first dielectric layer.

11. The method of claim 8, wherein said sacrificial layer comprises nitride.

12. The method of claim 11, wherein said sacrificial layer is removed by hot phosphorous acid solution.

13. The method of claim 8, wherein said HSG-Si layer is removed by chemical-mechanical polishing.

14. The method of claim 8, wherein said second dielectric layer comprises oxide/nitride or oxide/nitride/oxide.

* * * * *